United States Patent [19]

Ollivier

[11] Patent Number: 5,628,636

[45] Date of Patent: May 13, 1997

[54] CONNECTOR FOR A SUBSTRATE WITH AN ELECTRONIC CIRCUIT

[75] Inventor: Jean-Francois Ollivier, Merdrignac, France

[73] Assignee: Framatome Connectors International, Paris, France

[21] Appl. No.: 539,485

[22] Filed: Oct. 5, 1995

[30] Foreign Application Priority Data

Oct. 7, 1994 [NL] Netherlands .................. 9401657

[51] Int. Cl.⁶ .................................. H01R 9/09
[52] U.S. Cl. .................................. 439/70; 439/892
[58] Field of Search .................................. 439/66–73

[56] References Cited

U.S. PATENT DOCUMENTS

| | | | |
|---|---|---|---|
| 4,969,826 | 11/1990 | Grabbe | 439/66 |
| 5,232,372 | 8/1993 | Bradley et al. | 439/66 |
| 5,247,250 | 9/1993 | Rios | 439/70 |

FOREIGN PATENT DOCUMENTS

| | | |
|---|---|---|
| 0 255 244 A1 | 2/1988 | European Pat. Off. . |
| 0 386 853 A1 | 9/1990 | European Pat. Off. . |
| 0 405 762 A1 | 1/1991 | European Pat. Off. . |
| 0 619 696 A1 | 10/1994 | European Pat. Off. . |

*Primary Examiner*—Neil Abrams
*Assistant Examiner*—Eugene G. Byrd
*Attorney, Agent, or Firm*—Perman & Green

[57] ABSTRACT

A connector (1) for connecting a substrate (2) with an electronic circuit to a printed circuit board (11) comprises a housing (4) of insulating material with a zone (5) for receiving said substrate. A main surface of the substrate is provided with contact balls (3) arranged in a given grid pattern with a predetermined pitch in column and row directions and the printed circuit board is provided with contact pads (10) arranged in the grid pattern. Through-holes (6) are provided in the zone in the grid pattern and contact members (7) are provided in at least a part of the through-holes. Further the connector comprises positioning means for locating the substrate with respect to the housing in such a manner that the through-holes of the housing are aligned with the contact balls of the substrate. These positioning means comprises at least one reference plate (12) which can be positioned on the housing (4), the reference plate comprising through-holes (13) arranged in the grid pattern for at least a part of the contact balls (3) of the substrate (2). Each reference plate and the housing are provided with cooperating coupling means (14–17) for accurately positioning the reference plate with respect to the housing.

8 Claims, 4 Drawing Sheets

CONNECTOR FOR A SUBSTRATE WITH AN ELECTRONIC CIRCUIT

BACKGROUND OF THE INVENTION

The invention relates to a connector for connecting a substrate with an electronic circuit to a printed circuit board, wherein a main surface of the substrate is provided with contact balls arranged in a given grid pattern with a predetermined pitch in column and row directions and the printed circuit board is provided with contact pads arranged in said grid pattern, said connector comprising a housing of insulating material with a zone for receiving said substrate, wherein through-holes are provided in said zone in said grid pattern and contact members are provided in at least a part of said through-holes, and positioning means for locating the substrate with respect to the housing in such a manner that the through-holes of the housing are aligned with the contact balls of the substrate.

A connector of this type is described for example in U.S. Pat. No. 4,969,826 and U.S. Pat. No. 4,699,593. Such connectors are used for example for connecting the contact balls of the substrate to the contact pads of the printed circuit board. In a known substrate the contact balls are arranged in a grid pattern of 32×32. At this an accurate positioning of the substrate with respect to the housing and of the housing with respect to the printed circuit board is very important. The construction of the known connector is relatively complicated and further the connector is only suitable for a substrate of one size.

The invention aims to provide a connector of this type wherein the positioning means are made in a simple manner and allow for an accurate positioning of the substrate with respect to the contact members of the housing while the connector is further suitable for substrates of different sizes.

SUMMARY OF THE INVENTION

In the connector according to the invention said positioning means comprises at least one reference plate which can be positioned on the housing, said reference plate comprising through-holes arranged in said grid pattern for at least a part of the contact balls of the substrate, wherein each reference plate and the housing are provided with cooperating coupling means for accurately positioning the reference plate with respect to the housing.

In this manner a very simple positioning means is obtained by means of which the substrate can be positioned with respect to the contact members of the housing in a very accurate manner. The reference plate shows the important advantage that substrates of different sizes can be positioned on the housing of the connector. Because the reference plate is made as a separate component, reference plates with different sizes can be provided so that the connector is suitable for substrates of various sizes.

In order to provide for an easy locating of substrate of different sizes on a reference plate, a preferred embodiment of the invention is characterized in that the upper side of each reference plate is provided with reference marks for indicating the correct position of substrates of different sizes.

BRIEF DESCRIPTION OF THE DRAWINGS

The invention will be further explained hereinafter by reference to the drawings, in which an embodiment of the connector according to the invention is shown.

DETAILED DESCRIPTION OF THE PREFERRED EMBODIMENTS

Figure 1:
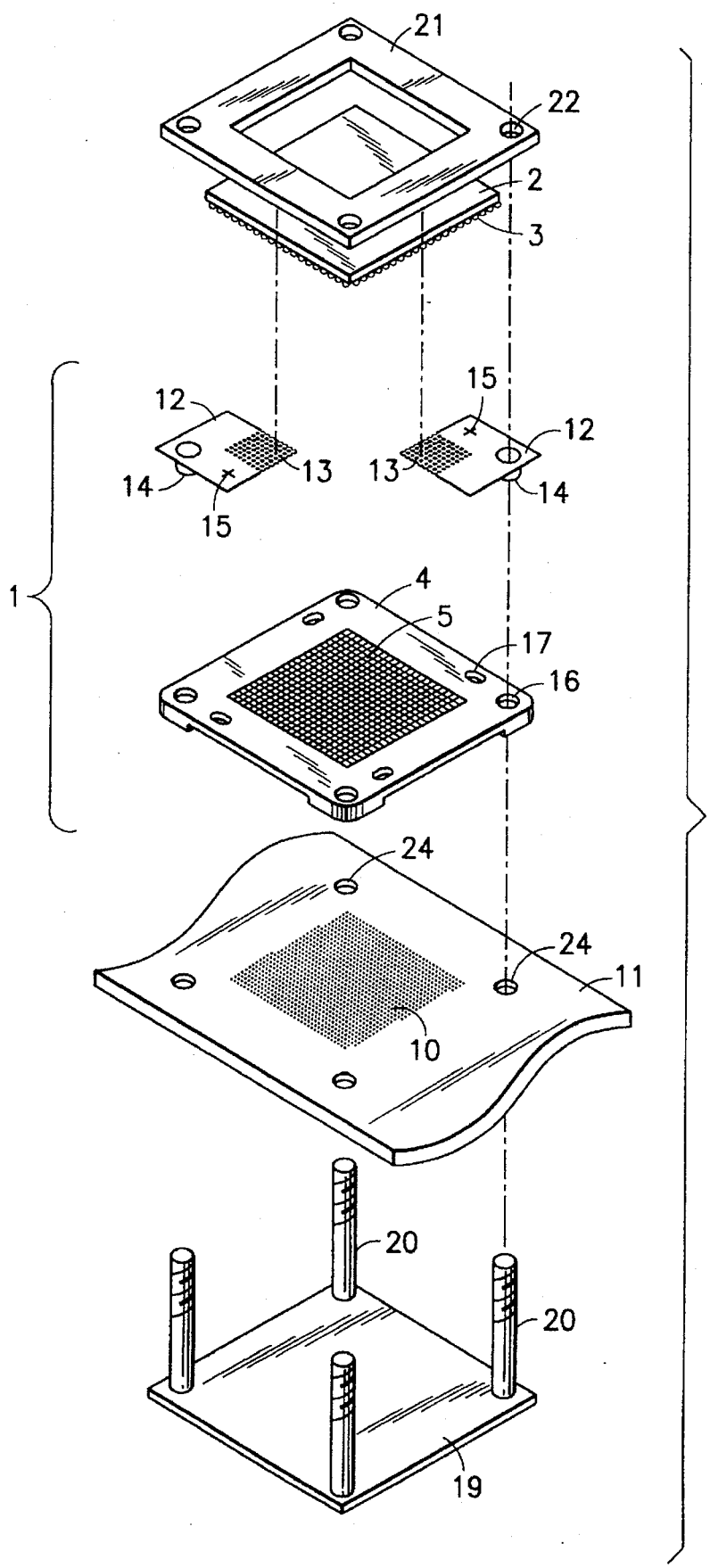
FIG. 1 shows an exploded view of an embodiment of the connector according to the invention, wherein a substrate, a part of a printed circuit board and the mounting means are also shown.

FIG. 1 shows an exploded view of a connector 1 for a substrate 2 with an electronic circuit. The substrate 2 is made as a so-called single chip package (SCP) of which the bottom main surface is provided with a large number of contact balls 3 which are arranged in a given grid pattern with a predetermined pitch in column and row directions of for example 1.27 mm. The contact balls 3 could for example be arranged in an array of 32×32.

Figure 3:
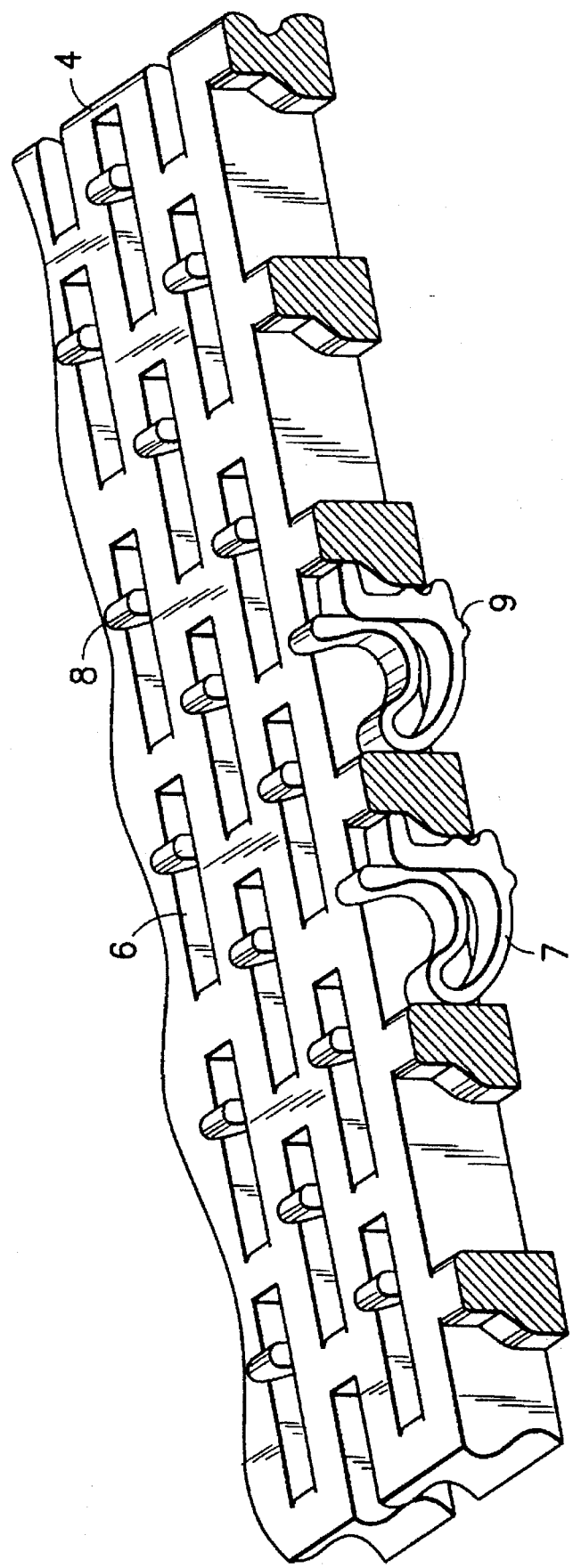
FIG. 3 partly shows a cross-section of the housing of the connector of FIG. 1 at a larger scale.

The connector 1 is provided with a housing 4 of insulating material with a zone 5 for receiving the SCP 2. As shown in FIG. 3 at a larger scale, through-holes 6 are provided in the zone 5 of the housing 4 in the same pattern as the contact balls of the SCP 2. A contact member 7 is mounted in each hole 6, a contact part 8 of the contact member 7 being adapted to contact a contact ball 3 and a contact part 9 being adapted to contact a contact pad 10 of a printed circuit board 11. These contact pads 10 of the printed circuit board 11 are of course arranged in the same pattern as the contact balls 3.

Figure 4:
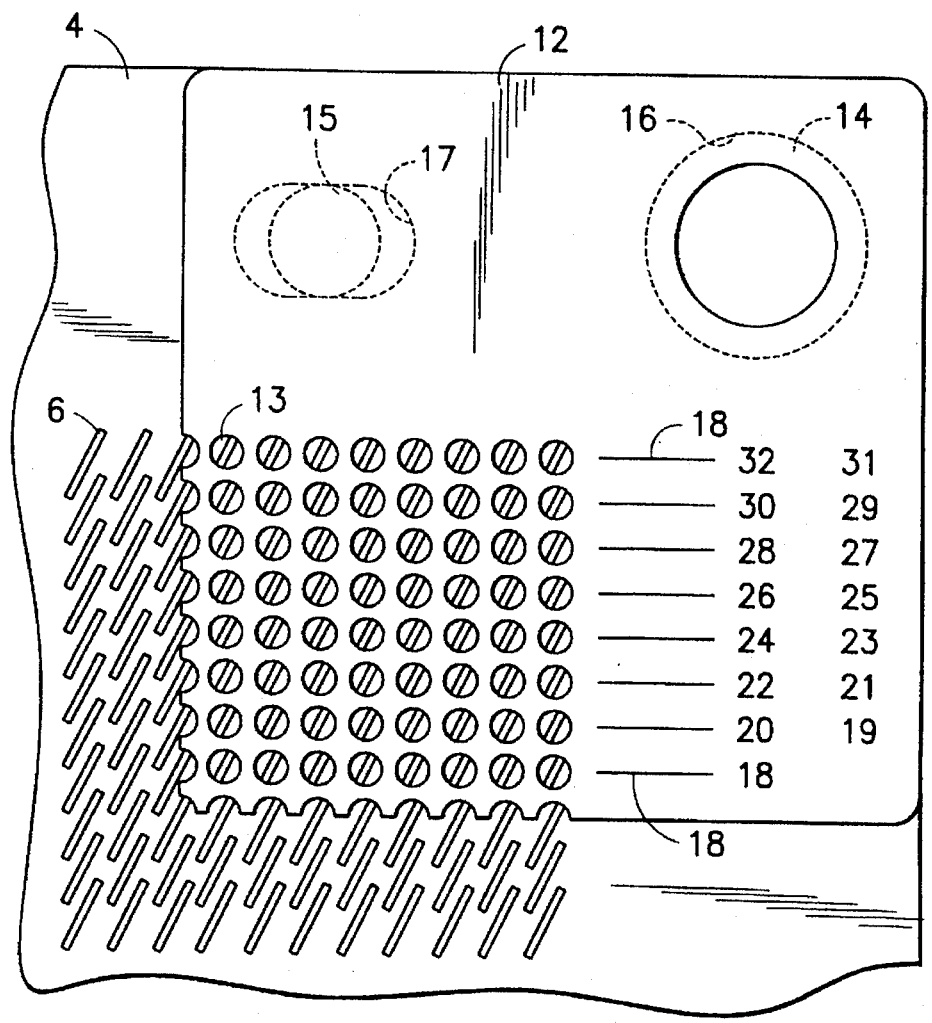
FIG. 4 partly shows a top view of the connector of FIG. 1 at a larger scale.

In order to obtain good connections between the contact balls 3 of the SCP 2 and the contact pads 10 of the printed circuit board 11 it is of course very important that the SCP 2 is positioned accurately with respect to the openings 6 in the housing 4 in such a manner that the contact balls 3 of the SCP 2 contact with certainty the contact parts 8 of the contact members 7 located in the openings 6. To this end the connector 1 comprises two reference plates 12 made of insulating material, each reference plate being provided with through-holes 13 as clearly shown in the top view of FIG. 4. The holes 13 are arranged according to the same pattern as the contact balls 3 and are accurately located above the holes 6 at the location of the contact parts 8 when the reference plate is located on the housing 4. The surface of each reference plate 12 is substantially smaller than the surface of the housing 4 so that only a part of the zone 5 is overlapped and holes 13 are provided for only a part of the contact balls 3. The thickness of the reference plates 12 is such that the contact balls of the SCP 2 can contact the contact parts 8 of the contact members 7 through the holes 13.

Figure 5:
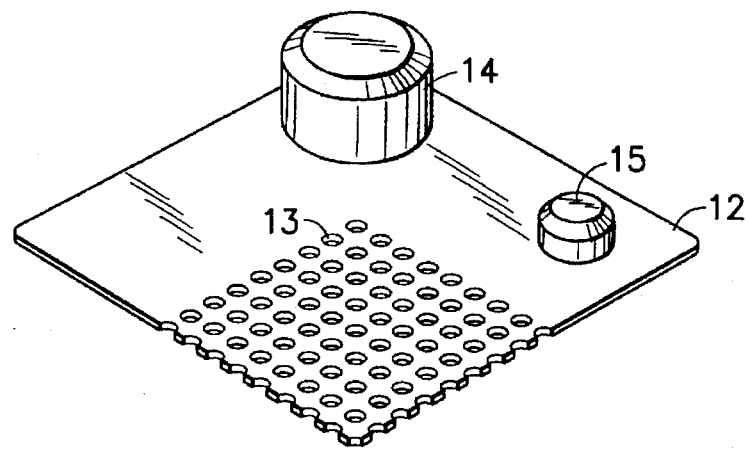
FIG. 5 is a perspective view of the bottom side of the reference plate of the connector of FIG. 1.

Each reference plate 12 can be positioned accurately with respect to the housing 4, in that each reference plate 12 is coupled with the housing 4 by means of a hollow pin at the bottom side and a projection 15 shown in FIG. 5. The housing 4 comprises at each corner an opening 16 in which the hollow pin 14 can be fittingly received and a slotted hole 17 for the projection 15. Because the hollow pin 14 and the projection 15, and the opening 16 and the slotted hole 17, respectively, are accurately located with respect to the holes 13 and the holes 6, respectively, each reference plate 12 can be positioned accurately on the housing 4 by means of these cooperating coupling means 14–17.

When the reference plates 12 are mounted on the housing 4, the SCP 2 can be placed easily in the correct position on the zone 5 of the housing 4. The reference plates described show the advantage that positioning of the SCP 2 with respect to the holes 6 in the zone 5 occurs by using the contact balls 3 of the SCP 2 themselves. Moreover the reference plates are suitable for substrates of different sizes. As indicated in the top view of FIG. 4 reference marks 18 are provided on the top side of each reference plate 12 by means of which substrates of different sizes can be placed on the same reference plate. Further reference plates of different sizes can be combined with the same housing 4. The housing 4 is also suitable for substrates of different sizes. If the substrate 2 is smaller than the zone 5 of the housing 4 it is possible to provide contact members 7 only in the holes 6 which will be lying opposite of contact balls 3 of the respective substrate 2, if desired.

Figure 2:
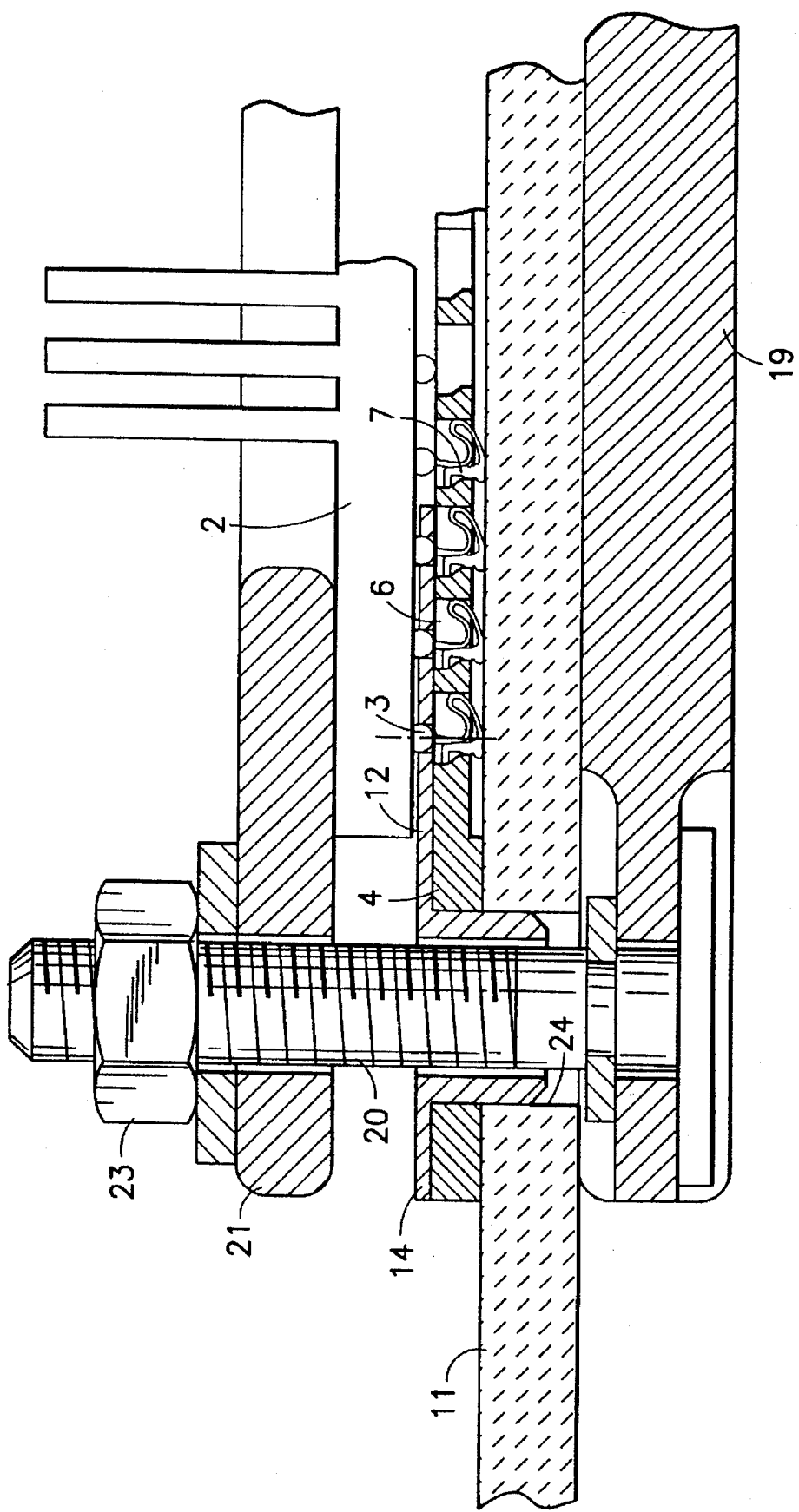
FIG. 2 partly shows a cross-section of the connector of FIG. 1 in assembled position.

FIG. 2 shows the connector 1 in assembled position. Attaching the substrate on the connector 1 and attaching the connector 1 on the printed circuit board 11, respectively, occurs by means of a mounting plate 19 with four mounting bolts 20 and a mounting frame 21 which is put on the mounting bolts 20 with openings 22. By means of nuts 23 the assembly is attached. FIG. 2 shows that the mounting bolt 20 extends through the hollow pin 14 of the reference plate 12 at the corresponding corner. This means that besides the openings for mounting the assembly no further openings need to be provided for positioning the reference plates 12 on the housing 4.

FIG. 2 further shows that the pin 14 of the reference plate 12 projects through the housing 4 and is fittingly received in an opening 24 of the printed circuit board 11. These openings 24 are accurately located with respect to the contact pads 10 of the printed circuit board 11. In this manner the pin 14 of each reference plate 12 provides also for a positioning of the housing 4 with respect to the contact pads 10 of the printed circuit board 11.

In the embodiment described two reference plates 12 are provided diametrically opposed with respect to the zone 5 of the housing 4. It is however also possible to use only one or more than two reference plates.

The invention is not restricted to the above-described embodiment which can be varied in a number of ways within the scope of the claims.

I claim:

1. Connector for connecting a substrate with an electronic circuit to a printed circuit board, said substrate having a main surface provided with contact balls arranged in a given grid pattern with a predetermined pitch in column and row directions, wherein the printed circuit board is provided with contact pads arranged in the grid pattern, said connector comprising a housing of insulating material with a zone for receiving said substrate, wherein through-holes are provided in said zone in the grid pattern and contact members are provided in at least a part of said through-holes, and positioning means for locating the substrate with respect to the housing in such a manner that the through-holes of the housing are aligned with the contact balls of the substrate, wherein said positioning means comprises at least one reference plate which can be positioned on the housing, said reference plate comprising through-holes arranged in said grid pattern for at least a part of the contact balls of the substrate, wherein each reference plate and the housing are provided with cooperating coupling means for accurately positioning the reference plate with respect to the housing.

2. Connector according to claim 1, wherein the coupling means of each reference plate also provide a positioning of the housing with respect to the contact pads of the printed circuit board.

3. Connector according to claim 1, wherein said coupling means comprises a pin formed at the lower side of each reference plate and a through-hole formed in the housing in which said pin can be fittingly received, said pin and opening being located at an accurately predetermined location with respect to the corresponding through-holes for the contact balls and the contact members, respectively.

4. Connector according to claim 2, wherein that pin of each reference plate projects through the opening of the housing and can be fittingly received in an opening of the printed circuit board, which is located at an accurately predetermined location with respect to the contact pads of the printed circuit board.

5. Connector according to claim 2, wherein the pin of each reference plate is hollow for receiving a mounting bolt.

6. Connector according to claim 2, wherein each reference plate comprises a projection at its lower side cooperating with a corresponding opening in said housing.

7. Connector according to claim 1, wherein the upper side of each reference plate is provided with reference marks for indicating the correct position of substrates with different sizes.

8. Connector according to claim 1, comprising two reference plates which can be positioned diametrically with respect to said zone of the housing.

* * * * *